(12) United States Patent
Takaoka et al.

(10) Patent No.: US 6,335,530 B1
(45) Date of Patent: Jan. 1, 2002

(54) OBJECTIVE LENS FOR SCANNING ELECTRON MICROSCOPE

(75) Inventors: Osamu Takaoka; Akira Yonezawa, both of Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/126,404

(22) Filed: Jul. 30, 1998

(30) Foreign Application Priority Data

Jul. 31, 1997 (JP) .................................................... 9-206777

(51) Int. Cl.[7] .................................................... H01J 37/141
(52) U.S. Cl. .................................... 250/396 ML; 250/310
(58) Field of Search ............................ 250/310, 396 ML, 250/396 R, 398

(56) References Cited

U.S. PATENT DOCUMENTS 4,961,003 A  * 10/1990  Yonezawa ..................... 250/310
5,023,457 A  * 6/1991   Yonezawa ..................... 250/310
5,241,176 A  * 8/1993   Yonezawa ..................... 250/310
5,734,164 A  * 3/1998   Sanford ........................ 250/310
5,894,124 A  * 4/1999   Iwabuchi et al. ............. 250/310

FOREIGN PATENT DOCUMENTS

| JP | 58161235 | 9/1983 |
| JP | 355751   | 3/1991 |
| JP | 6181041  | 6/1994 |
| JP | 8321272  | 12/1996 |

* cited by examiner

Primary Examiner—Bruce Anderson
(74) Attorney, Agent, or Firm—Adams & Wilks

(57) ABSTRACT

In an object lens of a type of generating a magnetic field of the side of a specimen and maing a principal plan of the lens close to the specimen for reducing aberration coefficients, an inner magnetic pole is formed in a shape of a cone having an angle of 30° of less to an optical axis and an outer magnetic pole is also provided inside the cone by which even the large-size specimen can be inclined up to about 60° and the large-size specimen can be observed with high resolution even when the specimen is inclined at a high angle.

34 Claims, 5 Drawing Sheets

OBJECTIVE LENS FOR SCANNING ELECTRON MICROSCOPE

BACKGROUND OF THE INVENTION

The present invention relates to an objective (hereinafter referred to as an object lens); lens for a scanning electron microscope capable of observing a large-sized specimen with high resolution in a low acceleration voltage region even when the specimen is inclined at a high angle.

In recent years, progress in miniaturization of a silicon semiconductor element has been particularly remarkable, and in order to carry out nondestructive visual inspection of an element, there has been required a scanning electron microscope capable of observing the element with high resolution at a low acceleration voltage region where little charge up or damage is caused by an electron beam requirements. In addition to the above-described requirements, in order to evaluate a side face of a pattern or a bottom of a contact hole on an element nondestructively, there has been needed a technology capable of observing the element with high resolution even when the specimen is inclined at a high angle. Meanwhile, formation of an increased diameter wafer has been developed, a wafer having a diameter of 12 inches is being put to practical use and there has been required a technology capable of observing a large-sized specimen with high resolution at a low acceleration voltage where the sample can be inclined at a high angle.

As a technology for allowing observation with high resolution at a low acceleration voltage, a technology has been put to practical use as disclosed in Unexamined Published Japanese Patent Application No. 3-1432 (FIG. 4), where a shape of an inner magnetic pole of a single pole magnetic field object lens for generating a magnetic field on the side of a specimen, which has been devised by T. Mulvey et al, is improved to reduce aberration coefficients for achieving high resolution by shifting an end face of an outer side magnetic pole to a position considerably rearward of an electron beam source so as to make a principal plane of the lens close to the sample even when the specimen is inclined. A similar technology has been disclosed in Unexamined Published Japanese Patent Application No. 62-256352, where high resolution is achieved by reducing the aberration coefficients by superposing an electric field and a magnetic field.

As another example of a single pole magnetic field object lens where a sample can be inclined, there has been somewhat less known of as disclosed in Unexamined Published Japanese Patent Application No. 8-227678 (FIG. 2) or Unexamined Published Japanese Patent Application No. 8-321272 (FIG. 3) of an application where, in order to avoid using a lens with a long focal length by which the aberration coefficients are increased, a shape of an outer magnetic pole of a single pole magnetic field object lens is devised such that a focal length is prevented from being lengthened as much as possible even when a sample is inclined.

However, according to the shape illustrated in FIG. 2 or FIG. 3, it is necessary for an inner magnetic pole 3a to be inclined more than an outer magnetic pole 3b and a top of the inner magnetic pole 3a must be tapered down to be made close to a specimen in order to shorten the focal length. However, when the specimen is inclined at about 60°, the aberration coefficients are not reduced thereby and further, magnetic saturation is likely to be caused at a top of the tapered inner magnetic pole 3a.

Meanwhile, in the single pole magnetic field object lens as shown in FIG. 4, although considerable magnetic excitation is necessary for focusing compared with the object lens of the type of FIG. 2 or FIG. 3, the lens can be made so as not to cause magnetic saturation since the degree of freedom of design of the inner magnetic pole 3a is large, and with an acceleration voltage of 15 KV or lower, the specimen can be observed with high resolution while the aberration coefficient is kept small even when a specimen having a size of about 6 inches is inclined at 60°. However, in order to deal with a large-size specimen such as a 12 inch wafer, an outer magnetic pole 3b and a coil 4 must be shifted in position upward in position to make magnetic excitation necessary for focusing be more and more enhanced and this makes the lens too difficult to be realized.

The present invention enables observation of a large-sized specimen with high resolution at a low acceleration voltage even when the specimen is inclined at an angle as high as about 60° at which such observation has been difficult according to the conventional technologies.

SUMMARY OF THE INVENTION

As shown in FIG. 1, when a side face of an inner cylinder forming the inner magnetic pole 3a of a single pole magnetic field object lens is formed in the shape of a sector of an imaginary cone having an angle of 30° or less with respect to an optical axis as shown by a dotted line in the drawing, and the outer magnetic pole 3b and a coil 4 are formed with shapes which can be provided inside the face of the imaginary cone, even a large diameter wafer 5 can be inclined up to about 60° and a large-sized specimen can be observed with high resolution even when the specimen is inclined at a high angle. Alternatively, the outer magnetic pole 3b and the exciting coil 4 may be provided inside a face of an imaginary cone having an angle of 30° or less with respect to the optical axis and being brought into contact with the outer magnetic pole 3b or the exciting coil 4, and the inner magnetic pole may be formed inside the face of the imaginary cone such that a lower end of a side face of an inner cylinder having a convergent cone shape forming the inner magnetic pole 3a is brought into contact with an end face of the imaginary cone.

FIG. 5 shows a comparison between on-axis magnetic flux density distributions calculated with respect to the shapes in FIG. 4 and FIG. 1. It is known that a maximum value and a way of distribution of the on-axis magnetic flux density remain almost the same even when the shape of the outer magnetic pole 3b or the shape of the coil 4 is changed. Even with actual measurement of the on-axis magnetic flux density using a Hall effect element, a result of measurement has been obtained such that it agrees with the above-described result of calculation. With respect to calculated values of the aberration coefficients, as shown in FIG. 6, the calculated values are not changed by a change in the shape of the outer magnetic pole 3b or a change in the shape of the coil 4 and the aberration coefficients are kept low. Although in the object lens of FIG. 1, considerable magnetic excitation is necessary for focusing as in that of FIG. 4, the degree of freedom of design of the inner magnetic pole 3a is larger than that of FIG. 2 or FIG. 3 by an amount which is not constrained by the outer side magnetic pole 3b. The object lens of FIG. 1 can be therefore made so as not to cause magnetic saturation with the aberration coefficients being kept low by increasing the thickness of the magnetic pole or devising the shape and accordingly, a large-sized specimen such as a 12 inch wafer can be observed with high resolution even when the specimen is inclined at an angle as high as about 60°.

DETAILED DESCRIPTION OF THE PREFERRED EMBODIMENTS

A detailed explanation will be given of embodiments of the present invention with reference to the drawings as follows.

Figure 7:
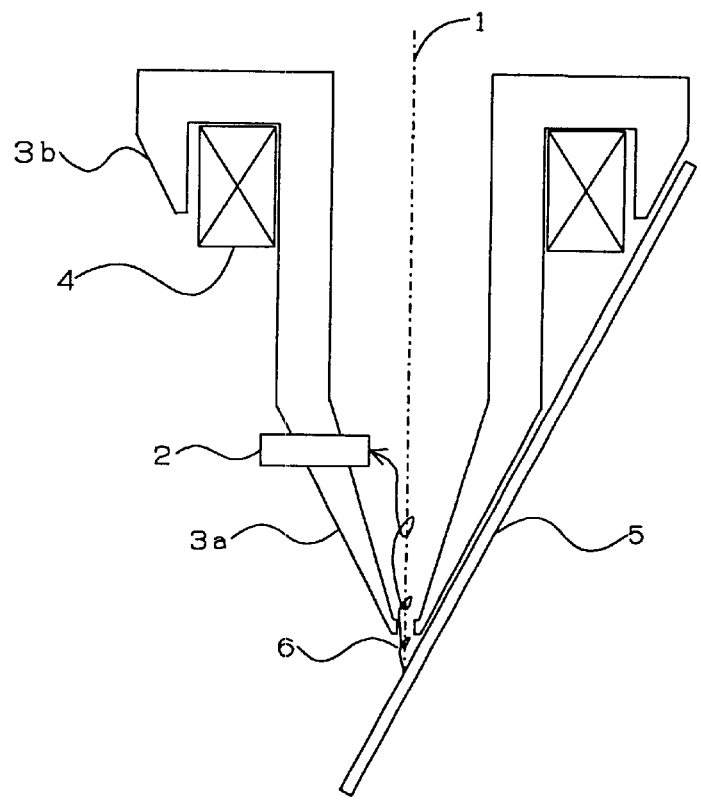
FIG. 7 is an explanatory view of an embodiment of the present invention.

FIG. 7 shows an embodiment of the present invention. According to the embodiment, an outer side face of an outer cylinder forming the outer magnetic pole 3b is formed in a shape of a cone converging toward a direction of an irradiated face of a specimen. That is, a chamfered portion is provided such that a corner of the outer magnetic pole is not brought into contact with the specimen. In this way, the inner magnetic pole 3a and the outer magnetic pole 3b in conical shapes and the coil 4 of the object lens are provided to be incorporated inside a face of a cone having an angle of 30° to the optical axis. Therefore, the large diameter wafer 5 can be inclined at 60° with a distance between the lower end of the inner magnetic pole 3a and the specimen (working distance) of 5 mm. When the angle to the optical axis is decreased to 30° or less, it is made possible to observe the specimen while the specimen is inclined at a further large angle.

Figure 1:
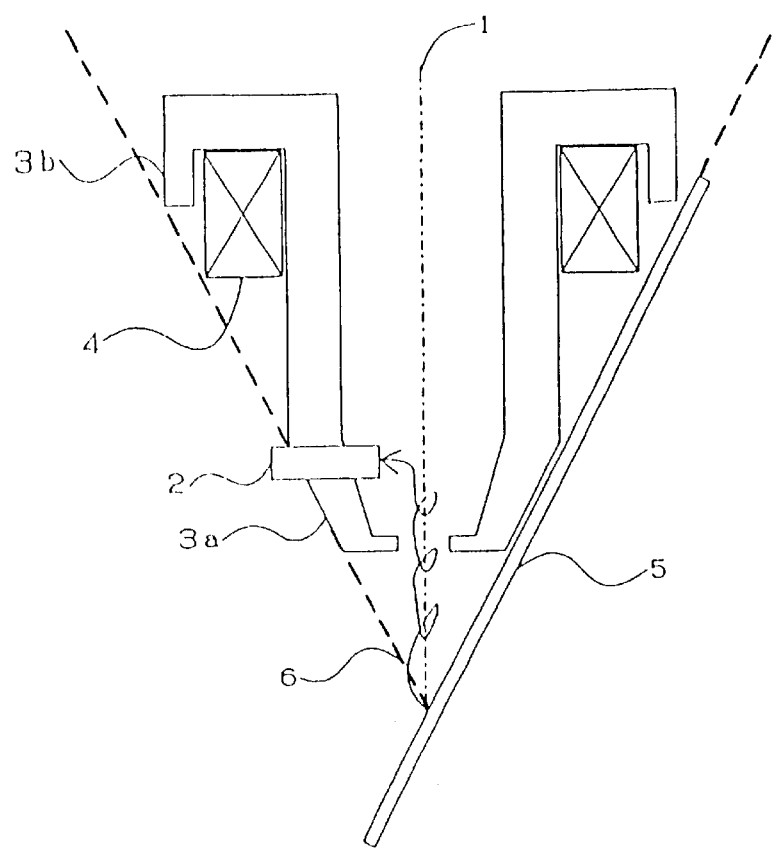
FIG. 1 is a view for explaining the characteristic of the present invention.
Figure 2:
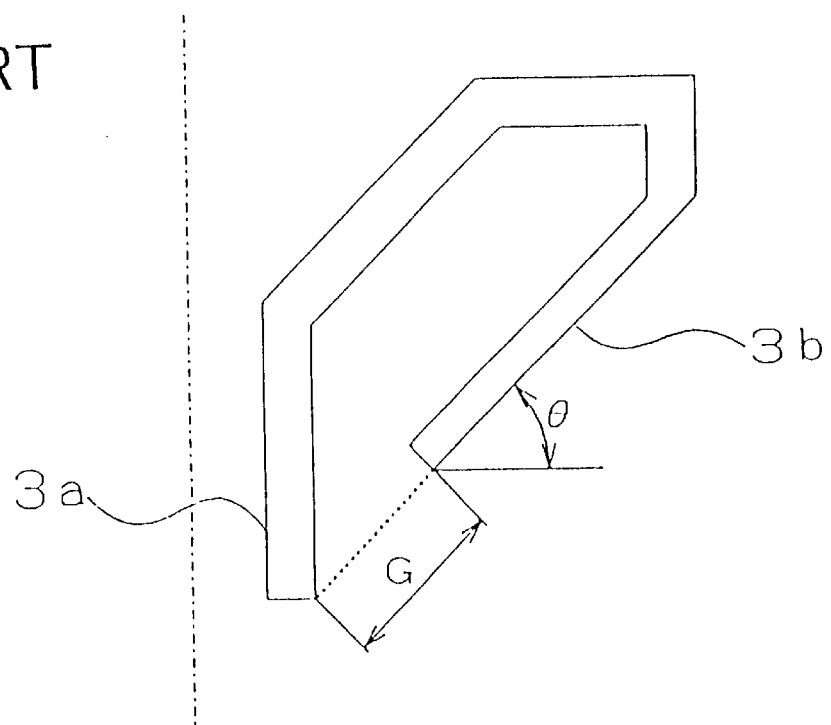
FIG. 2 is an explanatory view of a conventional example.
Figure 3:
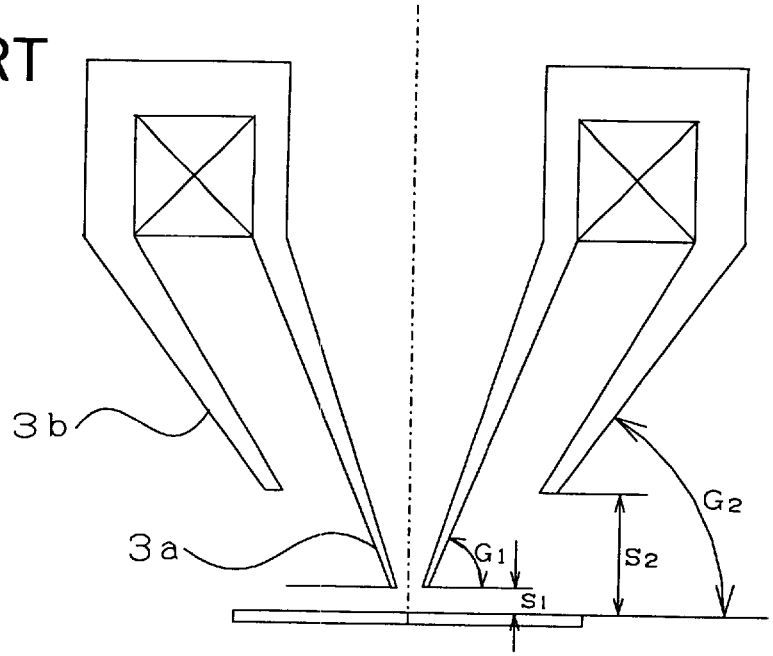
FIG. 3 is an explanatory view of a conventional example.
Figure 4:
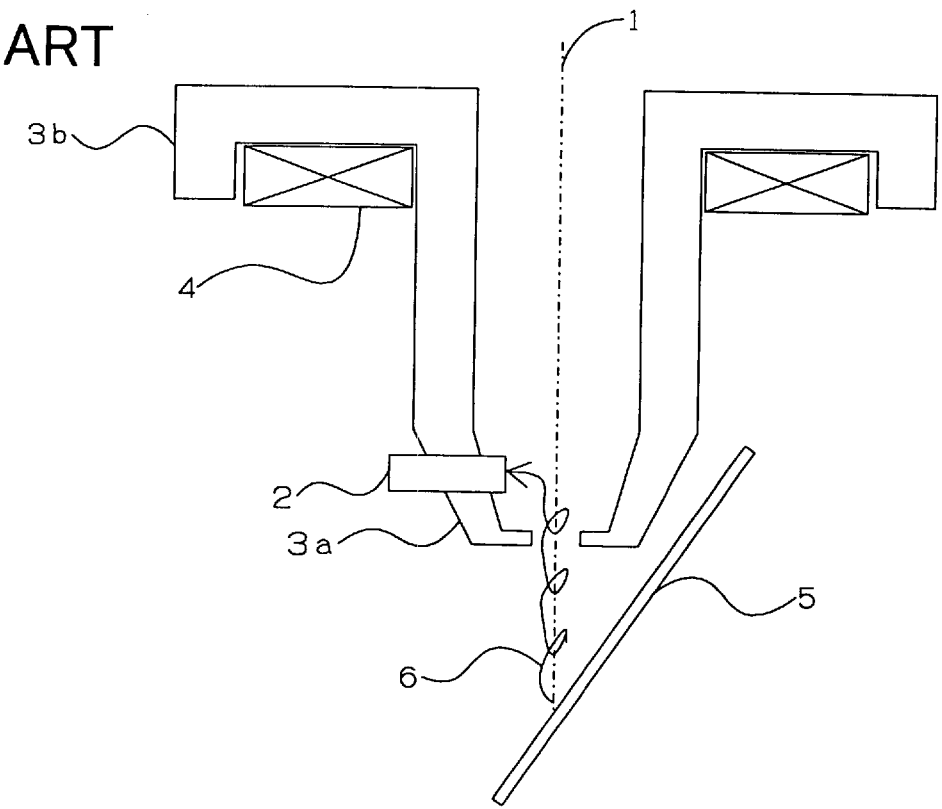
FIG. 4 is an explanatory view of a conventional example.
Figure 5:
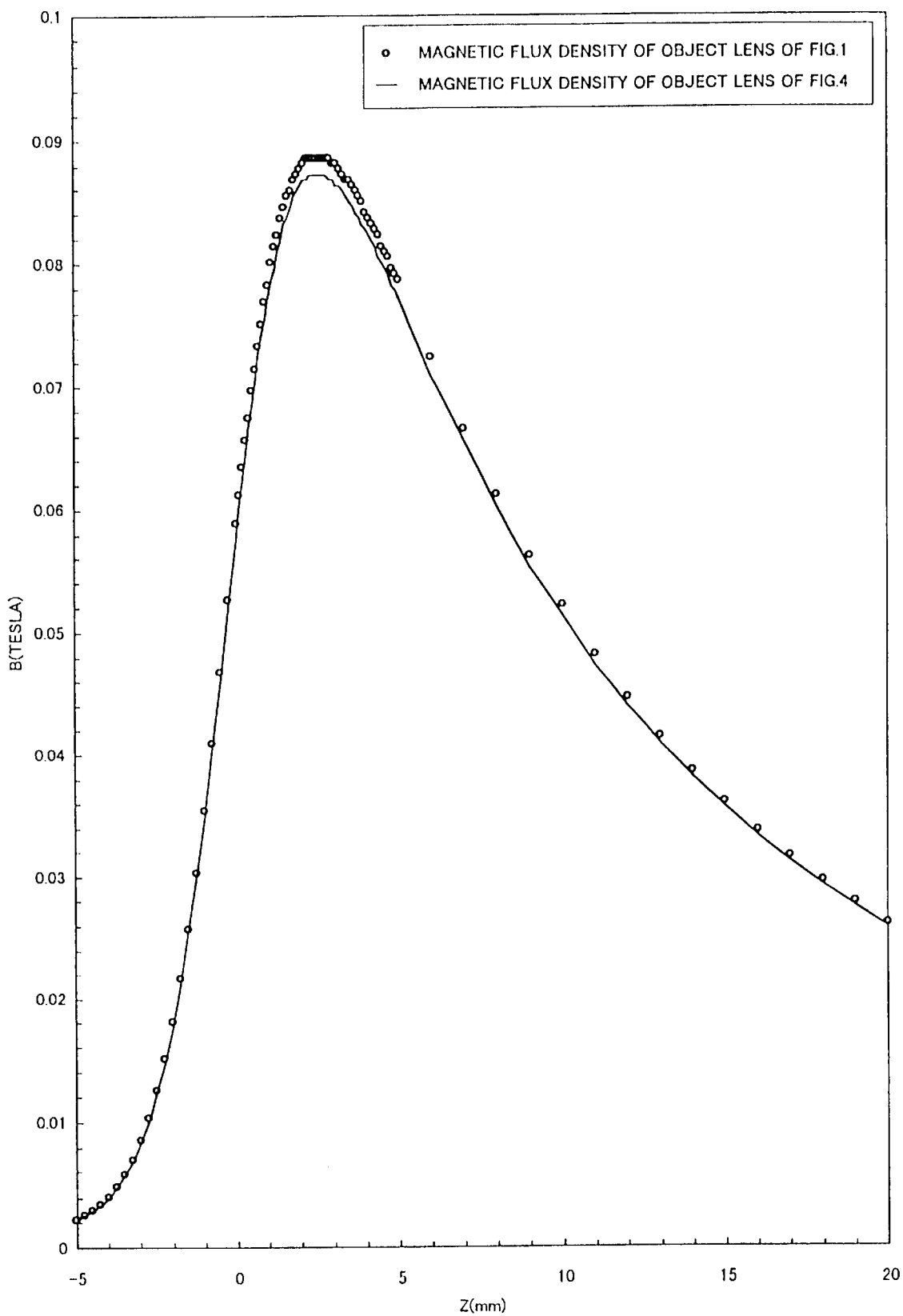
FIG. 5 is a diagram showing a comparison between the on-axis magnetic flux density distribution in the present invention and that in the conventional example of FIG. 4.
Figure 6:
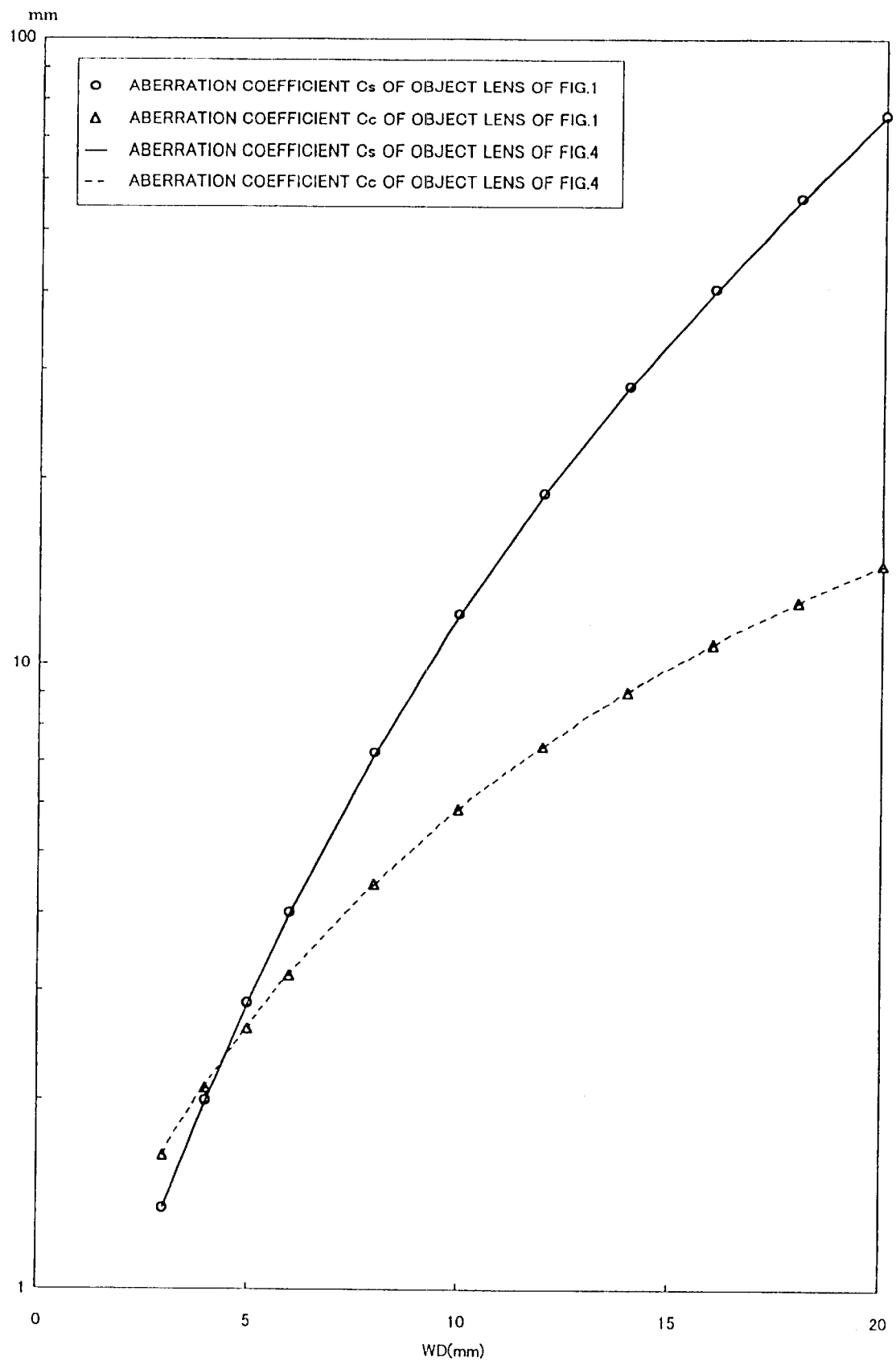
FIG. 6 is a diagram showing a comparison between the aberration coefficient in the present invention and that in the conventional example of FIG. 4.

According to the lens of FIG. 7, compared with that of FIG. 1, an end face of the outer magnetic pole can be made closer to the inner magnetic pole and, therefore, a value of current flowing in the coil 4 can be made small for obtaining the same focus.

Primary electron beam 1 emitted from an electron beam source is accelerated to about 1 kV and thereafter focused on the large diameter wafer 5 by a magnetic field of the single pole magnetic field object lens 3 generated on the side of the specimen. The coil 4 is for exciting the single pole magnetic field object lens 3. The slenderly concentrated primary electron beam 1 is made to scan the large diameter wafer 5 by a deflecting coil not shown in FIG. 7 and generated secondary electrons 6 are spiraled upward by the magnetic field and detected by a secondary electron detector 2 provided above the inner magnetic pole 3a of the object lens to thereby form a secondary electron image.

According to the calculation, with regard to the aberration coefficients of the object lens having the shape of FIG. 7, the spherical aberration coefficient is 8 mm and the chromatic aberration coefficient is 3 mm with the working distance of 5 mm. The chromatic aberration coefficient which is the dominant factor of resolution at low acceleration voltage is as small as 3 mm and therefore, the high resolution of 5 nm or less is made possible with the acceleration voltage of 1 kV even when the large diameter wafer 5 is inclined at 60°. The excitation necessary for focusing is made at about 940 Ampereturn under a condition of the working distance of 5 mm and saturation of magnetic field poses no problem in this case.

Figure 8:
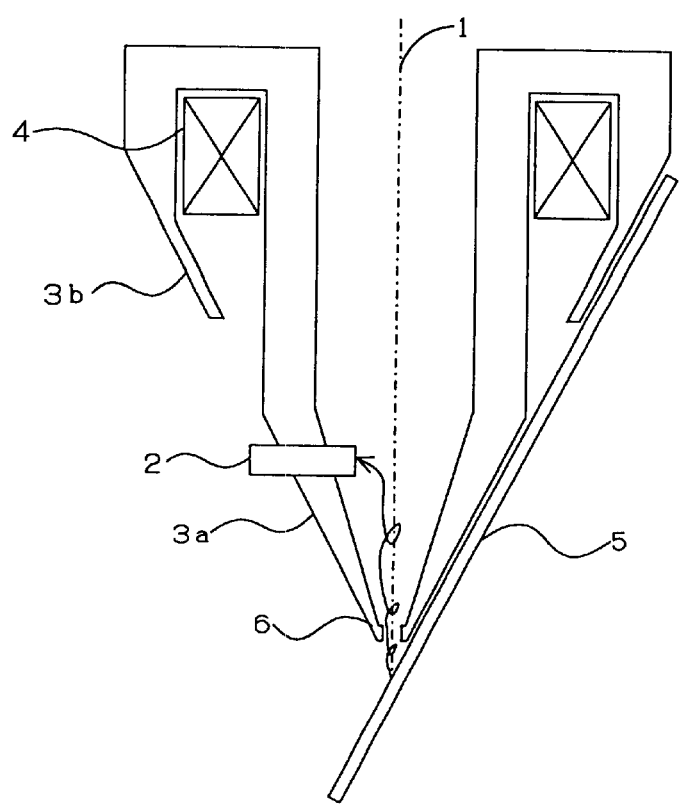
FIG. 8 is an explanatory view of an embodiment of the present invention.

FIG. 8 shows another embodiment of the present invention. According to the embodiment, an outer cylinder in a shape of a cone constituting the outer magnetic pole 3b is extended in a direction of an angle of a side face of an inner cylinder forming the inner magnetic pole 3a to the optical axis. Therefore, a gap between the outer side magnetic pole 3b and the inner magnetic pole 3a is narrowed and accordingly, the on-axis magnetic flux density becomes larger than that of FIG. 7 and focusing can be made with smaller excitation.

Although in FIG. 7 and FIG. 8, the angle of inclination of the inner magnetic pole and the outer magnetic pole to a face orthogonal to the optical axis is illustrated as being 60° which is the same as the angle of inclination of the specimen, it is of course easy to set the angle to be larger than 60°. In this case, even when the sample is inclined at 60°, a gap between the specimen and the lens is increased and, therefore, special interference is not liable to be caused and accuracy of inclination required to a specimen stage can be lowered.

As has been described, an inner magnetic pole of a single pole magnetic field object lens is formed in a shape of a cone having an angle of 30° or less to an optical axis and an outer magnetic pole is also provided inside the cone by which a large-sized specimen such as a 12 inch wafer can be made possible to be observed with high resolution at a low acceleration voltage of about 1 kV that causes little charge up and little damage of electron beam even when the specimen is inclined at an angle as high as about 60° at which such observation has been difficult according to the conventional technologies.

What is claimed is:

1. An objective lens for a scanning microscope disposed between a sample and a charged particle beam source for focusing a charred particle beam produced by the charged particle beam source, comprising: an inner magnetic pole piece at least a bottom portion thereof facing the sample having a conical outer surface the entirety of which extends along an axis disposed at an angle of 30° or less with respect to an optical axis of the lens, the conical outer surface portion of the inner magnetic pole piece comprising a sector of an imaginary cone tapering outward in a direction opposite the sample to extend rearward of the conical outer surface portion; an outer magnetic pole piece disposed substantially entirely inside the surface of the imaginary cone rearward of the conical outer surface portion of the inner magnetic pole piece; and an exciting coil disposed inside the surface of the imaginary cone rearward of the conical outer surface portion of the inner magnetic pole piece for exciting the inner and outer magnetic pole pieces.

2. An objective lens for a scanning microscope according to claim 1; wherein the outer magnetic pole piece has a conical outer surface portion disposed at an angle with respect to the optical axis of the lens.

3. An objective lens for a scanning microscope according to claim 2; wherein the conical outer surface portion of the outer magnetic pole piece extends in the direction of the imaginary cone.

4. An objective lens for a scanning microscope according to claim 3; wherein the conical outer surface portion of the outer magnetic pole piece is extended toward the conical outer surface portion of the inner magnetic pole piece to reduce a gap therebetween so that excitation necessary to achieve focusing on the sample is reduced.

5. An objective lens for a scanning microscope according to claim 2, wherein the conical outer surface portion of the outer magnetic pole piece is disposed at an angle of 30° or less with respect to an optical axis of the lens.

6. An objective lens for a scanning microscope according to claim 2; wherein the outer magnetic pole piece is generally cylindrical-shaped in portions other than the conical outer surface portion.

7. An objective lens for a scanning microscope according to claim 1; wherein the inner magnetic pole piece is generally cylindrical-shaped in portions other than the conical outer surface portion.

8. An objective lens for a scanning microscope according to claim 1; wherein the outer magnetic pole piece has a rectangular cross section having sidewalls substantially parallel to the optical axis.

9. An objective lens for a scanning microscope disposed between a sample and a charged particle beam source for focusing a charged particle beam produced by the charged particle beam source, comprising: an inner magnetic pole piece; an outer magnetic pole piece; and an exciting coil for exciting at least one of the pole pieces; wherein the inner pole piece, the outer pole piece and the exciting coil are disposed substantially entirely inside an imaginary cone having an outer surface extending at an angle of 30° or less with respect to an optical axis of the lens.

10. An objective lens for a scanning microscope according to claim 9; wherein the outer magnetic pole piece has a conical outer surface portion disposed at an angle with respect to the optical axis.

11. An objective lens for a scanning microscope according to claim 10; wherein the conical outer surface portion of the outer magnetic pole piece extends toward the conical outer surface portion of the inner magnetic pole piece to reduce a gap therebetween so that excitation necessary to achieve focusing on the sample is reduced.

12. An objective lens for a scanning microscope according to claim 10; wherein the outer magnetic pole piece is generally cylindrical-shaped in portions other than the conical outer surface portion.

13. An objective lens for a scanning microscope according to claim 9; wherein the inner magnetic pole piece is generally cylindrical-shaped in portions other than the conical outer surface portion.

14. An objective lens for a scanning microscope according to claim 9; wherein the outer magnetic pole piece has a rectangular cross section having sidewalls substantially parallel to the optical axis.

15. An objective lens for a scanning microscope according to claim 9; wherein at least a bottom portion of the inner magnetic pole piece facing the sample has a conical outer surface the entirety of which extends along an axis disposed at an angle of 30° or less with respect to an optical axis of the lens, the conical outer surface portion of the inner magnetic pole piece comprising a sector of an imaginary cone tapering outward in a direction opposite the sample to extend rearward of the conical outer surface portion.

16. An objective lens for a scanning microscope according to claim 15; wherein the outer magnetic pole piece has a conical outer surface disposed at the same angle as the conical outer surface portion of the inner magnetic pole piece.

17. An objective lens for a scanning electron microscope, comprising: a first pole piece disposed between an electron beam source and a sample support and defining a central aperture for passage of an electron beam produced by the electron beam source, the first pole piece having a conical outer surface portion extending along an angle of 30° or less with respect to an optical axis of the lens; a second pole piece magnetically coupled to the first pole piece and disposed on an opposite side of the first pole piece with respect to the sample support and rearward of the conical outer surface portion of the first pole piece; and a coil for exciting at least one of the pole pieces, the coil and the second pole piece being disposed within an imaginary cone having an outer surface extending at an angle of 30° with respect to the optical axis.

18. An objective lens according to claim 17; wherein the conical outer surface portion of the first pole piece has the form of a sector of the imaginary cone.

19. An objective lens according to claim 17; further comprising a secondary electron detector for detecting secondary electrons which enter the first pole piece.

20. An objective lens according to claim 17; wherein the second pole piece has a conical outer surface portion extending in the direction of the imaginary cone.

21. An objective lens according to claim 20; wherein the tapered surface portion of the second pole piece is generally conical-shaped.

22. An objective lens for a scanning microscope according to claim 17; wherein the outer magnetic pole piece has a rectangular cross section having sidewalls substantially parallel to the optical axis.

23. In an apparatus for directing a charged particle beam to a sample along a desired optical axis, an objective lens for focusing the charged particle beam onto the sample, the objective lens comprising: a first pole piece having a conical outer surface portion extending along an angle of 30° or less with respect to the optical axis; a second pole piece magnetically coupled to the first pole piece to form a magnetic circuit; and a coil for exciting the magnetic circuit to produce a magnetic field distribution; wherein the coil and the second pole piece are disposed substantially entirely inside an imaginary cone having an outer surface extending at an angle of 30° or less with respect to an optical axis of the lens.

24. An apparatus according to claim 23; wherein the conical outer surface portion of the first pole piece has the form of a sector of the imaginary cone.

25. An apparatus according to claim 23; wherein the second pole piece has a tapered surface portion extending along a surface of the imaginary cone.

26. An apparatus according to claim 25; wherein the tapered surface portion of the second pole piece is generally conical-shaped.

27. An apparatus according to claim 26; further comprising an electron beam source for generating the electron beam, the first and the second pole pieces being disposed between the electron beam source and the sample.

28. An objective lens for a scanning microscope according to claim 23; wherein the outer magnetic pole piece has a rectangular cross section having sidewalls substantially parallel to the optical axis.

29. A scanning microscope comprising: an electron beam source for generating and directing an electron beam in a path along an optical axis; a sample disposed in the path of the electron beam; and a single-pole objective lens for focusing the scanned electron beam onto the sample, the objective lens having a first pole piece having a conical outer surface portion extending at an angle of 30° or less with respect to the optical axis, a second pole piece magnetically coupled to the first pole piece to form a magnetic circuit, and a coil for exciting the magnetic circuit to produce a magnetic field distribution, the coil and the second pole piece being disposed substantially entirely inside an imaginary cone having an outer surface extending at an angle of 30° or less with respect to the optical axis.

30. A scanning electron microscope according to claim 29; wherein the conical outer surface portion of the first pole piece has the form of a sector of the imaginary cone.

31. A scanning electron microscope according to claim 29; wherein the second pole piece has a conical outer surface portion extending in the direction of the imaginary cone.

32. A scanning electron microscope according to claim 31; wherein the conical outer surface portion of the second pole piece has the form of a sector of the imaginary cone.

33. A scanning electron microscope according to claim 29; further comprising an electron beam source for generating the electron beam, the first and the second pole pieces being disposed between the electron beam source and the sample.

34. An objective lens for a scanning microscope according to claim 29; wherein the outer magnetic pole piece has a rectangular cross section having sidewalls substantially parallel to the optical axis.

* * * * *